United States Patent
Roeglinger

(10) Patent No.: US 11,448,521 B2
(45) Date of Patent: Sep. 20, 2022

(54) SYSTEM AND METHOD FOR PERFORMING MEASUREMENTS IN A MODULAR APPLICATION ENVIRONMENT

(71) Applicant: Rohde & Schwarz GmbH & Co. KG, Munich (DE)

(72) Inventor: Sebastian Roeglinger, Pfaffenhofen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 230 days.

(21) Appl. No.: 16/699,198

(22) Filed: Nov. 29, 2019

(65) Prior Publication Data

US 2021/0164805 A1 Jun. 3, 2021

(51) Int. Cl.
*G01D 3/10* (2006.01)
*G01D 9/06* (2006.01)

(52) U.S. Cl.
CPC ............... *G01D 3/10* (2013.01); *G01D 9/06* (2013.01)

(58) Field of Classification Search
CPC ............ G01D 3/10; G01D 9/06; G01D 9/005; G01D 21/00; G01R 13/00; G01R 23/00; G01R 27/04; G01R 21/133; G01R 22/10; G06F 9/44536; H04L 67/12; G05B 23/0264; G05B 19/042; G05B 13/028
USPC .......... 702/61, 119, 123, 127, 188; 717/124, 717/149
See application file for complete search history.

(56) References Cited

U.S. PATENT DOCUMENTS

| | | | | |
|---|---|---|---|---|
| 4,812,996 A | * | 3/1989 | Stubbs | G01R 1/025 324/121 R |
| 5,847,955 A | * | 12/1998 | Mitchell | G06F 13/105 700/86 |
| 6,421,354 B1 | * | 7/2002 | Godlewski | G08C 17/00 340/870.01 |
| 7,474,638 B2 | | 1/2009 | He et al. | |
| 2002/0055834 A1 | * | 5/2002 | Andrade | G06F 30/34 703/27 |
| 2003/0004674 A1 | * | 1/2003 | Thurman | G06F 15/173 702/123 |
| 2005/0128992 A1 | | 6/2005 | He et al. | |

(Continued)

FOREIGN PATENT DOCUMENTS

EP 1004085 A1 5/2000
EP 1100006 A2 5/2001

(Continued)

*Primary Examiner* — Jeffrey P Aiello
(74) *Attorney, Agent, or Firm* — Ditthavong, Steiner & Mlotkowski

(57) ABSTRACT

A system is provided for performing measurements in a modular application environment. The system comprises a digital measurement data recorder adapted to create raw digital data with respect to a measurement. The system further comprises at least two modular applications, adapted to perform at least two different data processing schemes, where one comprises a measurement unit module and the other comprises an application unit module. In this context, the measurement unit module is adapted to capture or process the raw digital data from the digital measurement data recorder. Moreover, the application unit module is adapted to process raw digital data and/or measurement results from the digital measurement data recorder into a user interface.

20 Claims, 6 Drawing Sheets

(56) References Cited

U.S. PATENT DOCUMENTS

| | | |
|---|---|---|
| 2005/0132332 A1 | 6/2005 | Sathe |
| 2005/0278684 A1 | 12/2005 | Hamilton et al. |
| 2007/0063871 A1 | 3/2007 | Engel et al. |
| 2007/0099570 A1* | 5/2007 | Gao .................. H04B 1/30 455/63.1 |
| 2013/0201316 A1* | 8/2013 | Binder .............. H04L 67/12 348/77 |
| 2013/0219219 A1* | 8/2013 | Schroeder ........ G06F 11/263 714/32 |
| 2014/0121846 A1 | 5/2014 | Dase |
| 2019/0012189 A1* | 1/2019 | Ura ................ G01R 31/31912 |
| 2019/0272155 A1* | 9/2019 | Chowdhary ......... H04W 4/38 |
| 2021/0014231 A1* | 1/2021 | Durbin ............ H04L 67/1097 |

FOREIGN PATENT DOCUMENTS

| | | |
|---|---|---|
| EP | 1461692 A2 | 9/2004 |
| WO | 99/09498 A1 | 2/1999 |
| WO | 03/017093 A2 | 2/2003 |

\* cited by examiner

SYSTEM AND METHOD FOR PERFORMING MEASUREMENTS IN A MODULAR APPLICATION ENVIRONMENT

TECHNICAL FIELD

The invention relates to a modular application environment for performing measurements, especially for signal or spectrum or network analysis for device and cloud environments.

BACKGROUND ART

Generally, the measurement and/or analysis product are in distinct nature that perform application specific analysis. An application from one product cannot be realized on another product even if the HF-Hardware of the products is able to perform the same set of measurements. For instance, an application (e.g., 5G, LTE) from a spectrum analyzer cannot be used on a network analyzer even if the HF-Hardware of the network analyzer satisfies the measurement requirement of the spectrum analyzer. Common methods for performing different analysis on measurement data are either based on distributed measurements or by installing analysis specific modules on measurement devices.

For example, the document U.S. Pat. No. 7,474,638 B2 shows a distributed measurement system including a host and a sub-system. The sub-system orchestrates the measurements and processing by operating as a measurement state machine and the component selection is done based on the type of measurement, processing requirements and state of the hardware/software components. The host receives the processed data and performs post-processing if needed and further displays the processed data. However, the components are dedicated to the nature of the measurement and are not reusable, for instance, in order to build the measurements devices and cloud solutions with the same software modules.

Accordingly, there is a need to provide a system and a method for facilitating a modular application environment for measurements in order to provide a common platform for measurement data analysis.

SUMMARY OF THE INVENTION

According to a first aspect of the invention, a system for performing measurements in a modular application environment is provided. The system comprises an digital measurement data recorder adapted to create raw digital data with respect to a measurement. The system further comprises at least two modular applications, adapted to perform at least two different data processing schemes, where one comprises a measurement unit module and the other comprises an application unit module. In this context, the measurement unit module is adapted to capture or process the raw digital data from the digital measurement data recorder. Moreover, the application unit module is adapted to process raw digital data and/or measurement results from the digital measurement data recorder into a user interface.

Therefore, a modular application environment is facilitated in order to provide a common platform for measurement data analysis. The modular applications are able to perform a series of data processing schemes on the raw digital data. The data processing schemes can be based on, for instance, error vector magnitude measurements, group delay, gain, Fast-Fourier transformation, channel power measurements, adjacent channel leakage ratio, in-band unwanted emissions, swept frequency measurements, swept power measurements and the like. The measurement unit module may collect the raw digital data, for instance, digital measurement data corresponding to I/Q data, histogram, sweep-traces and the like, and may further process the raw data, thereby providing respective measurement results. The application unit module processes the measurement results into the user interface, for instance, by means of graphical representation. Additionally or alternately, the application unit module may further forward the results to additional end user interfaces for distribution or to stand-alone units for post processing.

This is particularly advantageous, for example, in the case when a device under test (DUT) is being tested or simulated at a measurement site. Generally, the measurement loop comprises a signal generator for baseband generation (e.g., receiver measurement) along with a stand-alone signal/spectrum analyzer (e.g., simulation and transmitter measurement), where the measurement devices are controlled by a computer on site. By implementing the modular applications on the signal/spectrum analyzer, raw digital measurement data can be captured and processed and may be further analyzed on-site as well as can be pushed to other locations for post-processing (e.g., another measurement site, computing nodes etc. connected via a network).

According to a first preferred implementation form of said first aspect of the invention, the modular applications are modularly installed on the digital measurement data recorder whereby the measurement unit module is included as an integral module and the application unit module is included as a separate module. Therefore, the measurement unit module and the application unit module are acting as a pair of loosely coupled functional units that are integrated into the modular application. Advantageously, the measurement unit module and the application unit module are independent of each other; however, they are able to communicate with each other.

According to a second preferred implementation form of said first aspect of the invention, the processing of the raw digital data by the measurement unit module is executed on the digital measurement data recorder. In other words, the measurement unit module is executed on the digital measurement data recorder. Advantageously, the digital measurement data recorder is able to process the measurement data.

According to a further preferred implementation form of said first aspect of the invention, the processing of the measurement results by the application unit module is executed on a cloud environment. Alternately, if the cloud service is unavailable, for instance, if there is no cloud computing element, the application unit module may also be installed on the digital measurement data recorder or on a local computer controlling the digital measurement data recorder and can be executed on it.

According to a further preferred implementation form of said first aspect of the invention, the measurement unit module of the respective modular application is further adapted to be activated on-demand based on the measurement predefined on the digital measurement data recorder. Thus, whether a different set of measurements are required to be performed or a different processing scheme is needed, the measurement unit module can be downloaded accordingly on the digital measurement data recorder. Advantageously, a high degree of measurement flexibility is incorporated.

According to a further preferred implementation form of said first aspect of the invention, the application unit module is further adapted to receive measurement instructions from a user via the user interface and is further adapted to create unique identifiers for the respective measurement instructions. In this context, the unique identifiers are associated with requests directed towards the digital measurement data recorder from the application unit module and are further associated with the measurement results provided from the digital measurement data recorder to the application unit module. Therefore, the application unit module receives measurement instructions or prescribed settings from the user and creates a unique identifier, for instance, a universally unique identifier (UUID) for the respective instructions and/or settings. The UUID is associated with the request sent to the digital measurement data recorder and any results provided from the digital measurement data recorder to the application unit module. Additionally or alternatively, the unique identifier can be implemented via checksum, for instance, a SHA-checksum. Advantageously, data-parsing reliability is significantly improved.

According to a further preferred implementation form of said first aspect of the invention, the modular applications can include more than one version of the same application and whereby the versions of the applications are modularly installed on the digital measurement data recorder. Advantageously, more than one version of the same application are installed on the same digital measurement data recorder that allows for effective revisioning.

According to a further preferred implementation form of said first aspect of the invention, the system further comprises a modular software manager, provided on the user interface, adapted to facilitate user controllability for defining a measurement on the digital measurement data recorder. Advantageously, user flexibility is further enhanced.

According to a further preferred implementation form of said first aspect of the invention, the modular software manager is further adapted to determine software required by the digital measurement data recorder dynamically with respect to the defined measurement. Therefore, the modular software manager may dynamically determine the necessary software of the digital measurement data recorder, which may be less than all software the user is entitled to use.

In this context, the modular software manager, either by means of user interactions or by historical tracking, knows which modules the user is entitled to use but not using for a certain span of time. In such cases, the modular software manager may remove the unused module temporarily and may re-download it in the future on-demand. For instance, the user may be entitled to use a test suite but has not been using the suite in months. The modular software manager therefore removes the test suite temporarily from the digital measurement data recorder in order to keep the installed software lite.

According to a second aspect of the invention, a method for performing measurements in a modular application environment is provided. The method comprises the step of creating raw digital data with respect to a measurement by a digital measurement data recorder. In addition, the method comprises the step of performing at least two different data processing schemes by at least two modular applications, one comprising a measurement unit module and the other comprising an application unit module. Furthermore, the method comprises the step of capturing or processing the raw digital data from the digital measurement data recorder by the measurement unit module. Moreover, the method comprises the step of processing raw digital data and/or measurement results from the digital measurement data recorder by the application unit module into a user interface.

Therefore, a modular application environment is facilitated in order to provide a common platform for measurement data analysis.

According to a first preferred implementation form of said second aspect of the invention, the method further comprises the step of modularly installing the modular applications on the digital measurement data recorder whereby including the measurement unit module as an integral module and the application unit module as a separate module. Advantageously, the measurement unit module and the application unit module are independent of each other; however, they are able to communicate with each other.

According to a second preferred implementation form of said second aspect of the invention, the method further comprises the step of executing the processing of the raw digital data by the measurement unit module on the digital measurement data recorder. Advantageously, the digital measurement data recorder is able to process the measurement data.

According to a further preferred implementation form of said second aspect of the invention, the method further comprises the step of executing the processing of the measurement results by the application unit module on a cloud environment. Alternately, the application unit module may also be installed and can be executed on the digital measurement data recorder. Alternatively, all further processing is done in the application unit module.

According to a further preferred implementation form of said second aspect of the invention, the method further comprises the step of activating the measurement unit module of the respective modular application on-demand based on the measurement predefined on the digital measurement data recorder. Advantageously, a high degree of measurement flexibility is incorporated.

According to a further preferred implementation form of said second aspect of the invention, the method further comprises the step of receiving measurement instructions from a user via the user interface and thereby creating unique identifiers for the respective measurement instructions. In addition, the method further comprises the steps of associating the unique identifiers with requests directed towards the digital measurement data recorder from the application unit module and associating the unique identifiers with the measurement results provided from the digital measurement data recorder to the application unit module. Advantageously, data-parsing reliability is significantly improved.

According to a further preferred implementation form of said second aspect of the invention, the modular applications include more than one version of the same application and the method further comprises the step of modularly installing the versions of the applications on the digital measurement data recorder. Advantageously, more than one version of the same application are installed on the same digital measurement data recorder that allows for effective revisioning.

According to a further preferred implementation form of said second aspect of the invention, the method further comprises the step of facilitating user controllability for defining a measurement on the digital measurement data recorder by a modular software manager, provided on the user interface. Advantageously, user flexibility is further enhanced. Modules with some overlapping functions may be available so the user or system can choose where the processing occurs based on, for example, resource availability, network availability and efficiency. Modules may further have different levels of processing in different versions so the user can choose the one that does the processing at his intended location.

According to a further preferred implementation form of said second aspect of the invention, the method further comprises the step of dynamically determining software required by the digital measurement data recorder with respect to the defined measurement by the modular software manager. Advantageously, the modular software manager may dynamically determine the necessary software of the digital measurement data recorder, which may be less than all software the user is entitled to use.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Reference will now be made in detail to the embodiments of the present invention, examples of which are illustrated in the accompanying drawings. However, the following embodiments of the present invention may be variously modified and the range of the present invention is not limited by the following embodiments.

Figure 1:
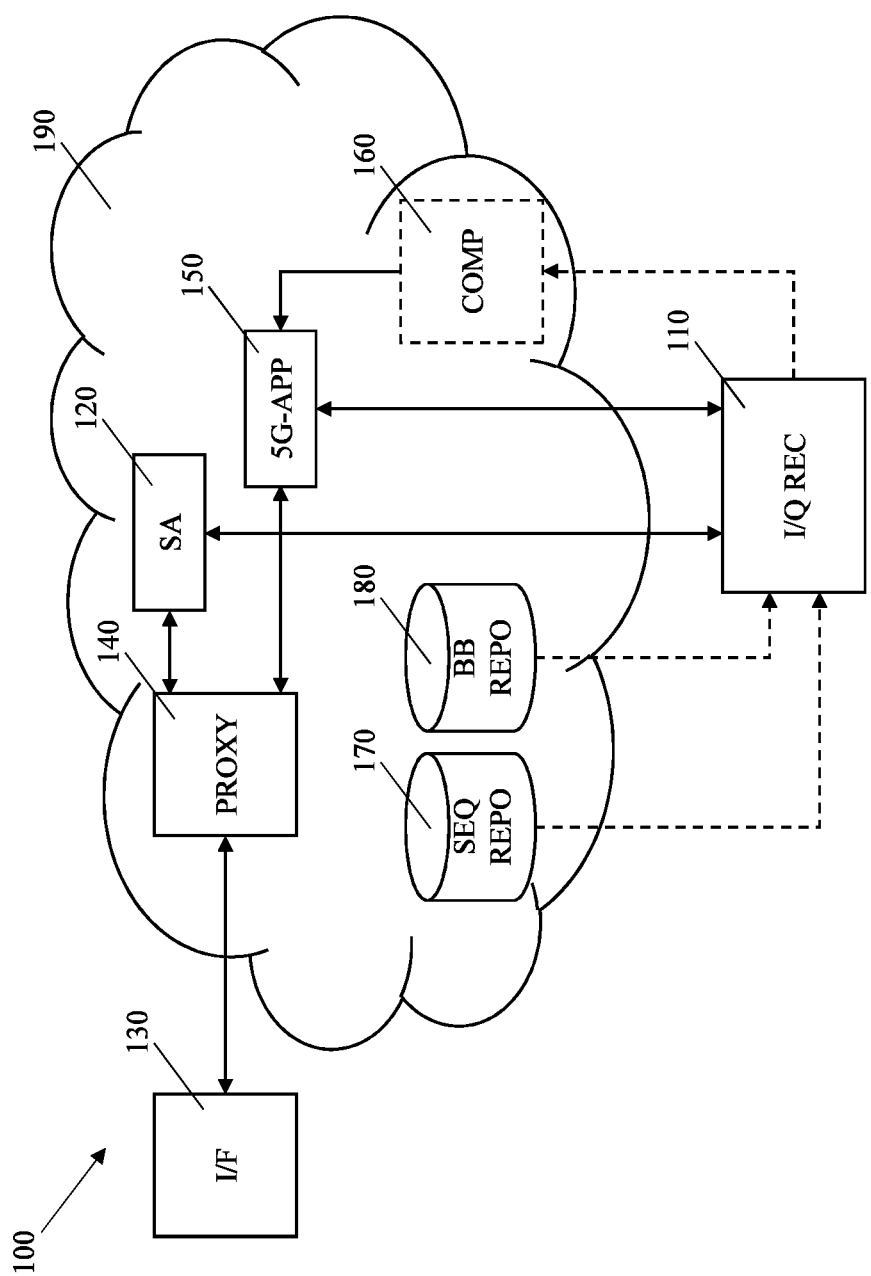
FIG. 1 shows a first exemplary embodiment of the system according to the first aspect of the invention.

In FIG. 1, a first exemplary embodiment of the system 100 according to the first aspect of the invention is illustrated. The system comprises a digital measurement data recorder, herein implemented as an I/Q measurement recorder 110 that creates raw digital data, especially I and Q data representing the in-phase and quadrature components respectively of an amplitude versus time series. The I/Q measurement recorder 110 preferably generates the in-phase and quadrature components of measurement data based on a predefined set of measurements. At least two modular applications are installed and/or downloaded on the I/Q measurement recorder 110 that are associated with different data processing schemes of the raw digital data. Herein, one modular application corresponds to a measurement unit part or module that is executed on the I/Q measurement recorder 110 and the other corresponds to an application unit part or module 120 that is preferably executed in a cloud environment or service 190.

In particular, the measurement unit module captures and processes the raw digital data from the I/Q measurement recorder 110 thereby generates respective measurement data and/or results and the application unit module 120 processes the raw digital data as well as measurement results from the I/Q measurement recorder 110 into a user interface 130. The user interface 130 can be implemented as a web browser (e.g., web-GUI), an iOS/android application, a third-party interface application (e.g., Electron App), a widget toolkit for GUI (e.g., QT App), or other interface (e.g., based on Standard Commands for Programmable Instruments).

The user interface 130 communicates with the application unit module 120 and any additional application required for generating data processing instruction, e.g., 5G App 150, via a proxy 140 or load balancer in order to distribute user settings to respective modules or applications in the cloud environment 190. The cloud environment 190 further allows for a sequence repository 170 and a building block repository 180 for facilitating measurement sequences and building block process respectively onto the I/Q measurement recorder 110. In this context, the I/Q measurement recorder 110 is able to access the repositories 170,180 locally, for instance, by incorporating the cloned versions of the repositories 170,180.

For additional post-processing of the measurement results, which may be required by the user but not performed within the I/Q measurement recorder 110, the cloud environment 190 may allow for high performance cloud computing 160 by incorporating remote computing nodes on the cloud server. Due to the modular nature of the applications, a plurality of I/Q measurement recorders 110 can be implemented that may process the raw data locally and further allows for different processing schemes for different measurement settings by means of different application unit module 120 that are distributed or in a cloud environment 190.

Figure 2:
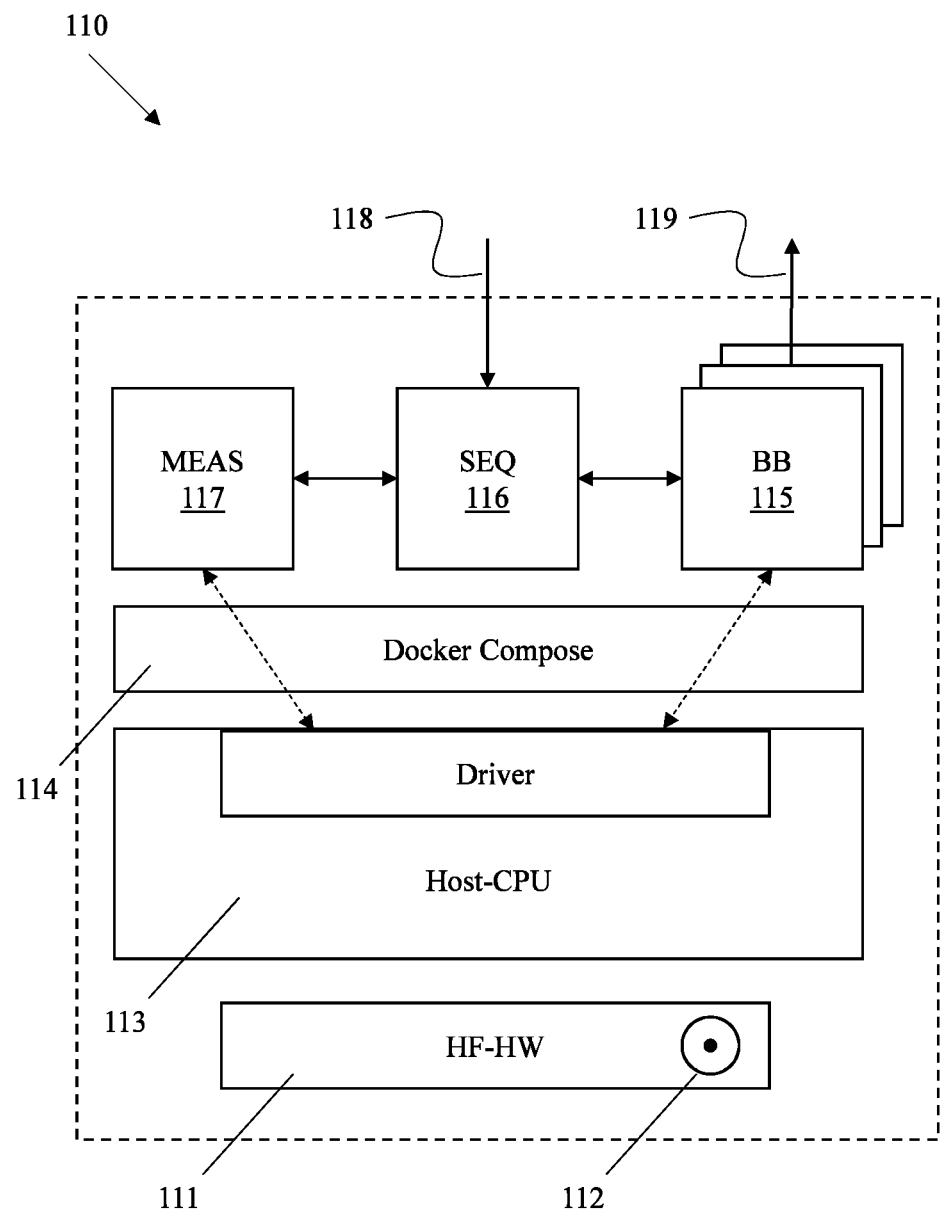
FIG. 2 shows an exemplary representation of the I/Q measurement recorder in blocks.

In FIG. 2, an exemplary representation of the I/Q measurement recorder 110 is illustrated in blocks. Herein, the I/Q measurement recorder 110 is realized on the Docker engine. The I/Q measurement recorder 110 comprises measurement hardware 111 along with RF input channel 112 in order to produce measurement data, especially raw digital data. A host processor 113, e.g., a host central processing unit with Linux-Kernel, allows for pre-processing of the data and further provides an essential driver for the measurement hardware. The driver of the host processor 113 further provides control over the I/Q data and memory mapping.

The I/Q measurement recorder 110 further comprises a Docker compose tool 114 that facilitates the reproducibility of the application by creating an isolated environment for the application and thereby interacting with it. In order to perform processing with building blocks, a block process 115 container is incorporated, which communicates with a sequencer 116 container and further with a measurement and control container 117. Hence, the package represents a multi-container Docker application. For building block processing and for the measurement sequence, respective repositories are loaded to the block process 115 and the sequencer 116 in order to access the repositories locally.

In this context, the data processing is computed asynchronously, preferably independent of the capture sequence of the measurement data. Additionally or alternatively, sequential processing of the captured data can be performed is required. The input to the block process 115 is generally I/Q data, however, input might also be in the form of sweep-traces. The block process 115 has direct access to the hardware 111 through the driver of the host processor 113, which allows for full performance with regard to data throughput. The sequencer 116 receives user instructions 118, conveyed by the application unit module, with respect to the nature of the measurement as well as UUIDs (e.g., setting-UUID, sequence UUID). In turn, the block process 115 outputs streams of results 119 and/or setting-UUIDs towards the application unit module, where the measurement results are further processed to presentable forms, for instance, in a graphical representation.

Therefore, the I/Q measurement recorder 110 is not only configured to perform measurements but also adapted to pre-process the measurement data. Hence, the I/Q measurement recorder 110 allows for simplicity whereby incorporating the ability to load and execute sequences and processing at runtime. The I/Q measurement recorder 110 may act as a stand-alone measurement and data generation unit. Additionally or alternately, further I/Q measurement recorders 110 can be incorporated, for instance, in a master-slave configuration, in order to broaden the scope of the measurement and/or to perform distributed measurement and processing.

Figure 3:
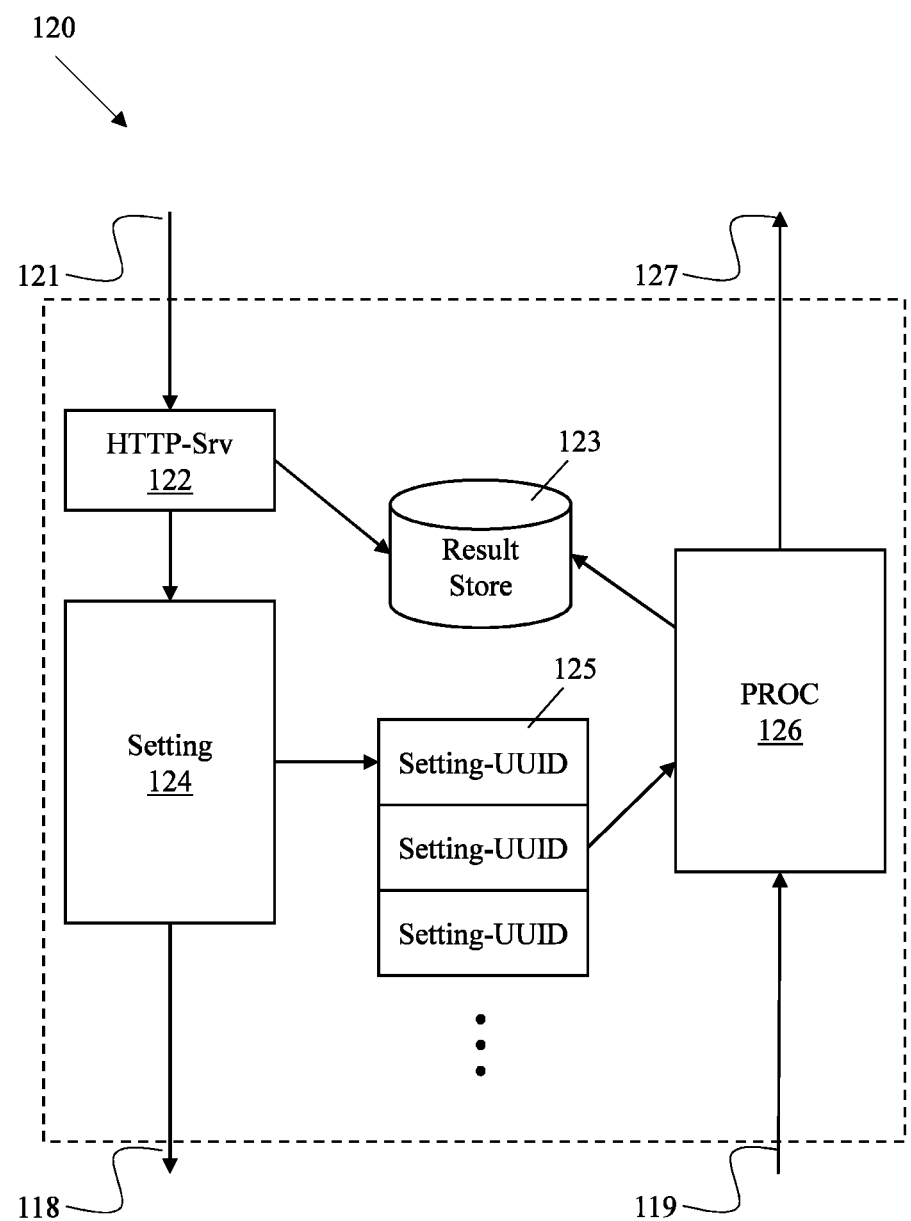
FIG. 3 shows an exemplary representation of the application unit module as a modular application in blocks.

In FIG. 3, an exemplary representation of the application unit module 120 as a modular application is illustrated in blocks. Herein, the application unit module 120 is realized on Docker engine in the form of a Docker container that packages up codes and their dependencies and thereby can be executed from one computing environment to another. The application unit module 120 receives user interactions 121 through the user interface 130 onto a server 122, preferably using standard commands based on, for example, Hypertext Transfer Protocol (HTTP), File Transfer Protocol (FTP), Virtual Instrument Software Architecture (VISA) and so on for communicating. For instance, the application unit module 120 may be instructed by a user for spectrum analysis of the measurement results received from the I/Q measurement recorder 110. The server 122 can access to a data storage 123 that stores the measurement results. Thus, the memory of the I/Q measurement recorder 110 and/or of any capture device's I/Q memory can be mapped directly into the application's memory, even if it runs in a Docker container.

A setting script 124, directed by the user via the server 122, allows for validating settings and further able to create and/or choose UUIDs for the settings as well as for the measurement sequences. If the user initiates a new task, for instance, a modification on the predefined measurement, the setting script 124 further facilitates a description of the task based on the modifications performed by the user. The UUIDs as well as the descriptions 118 are fed to the I/Q measurement recorder 110, especially onto the local sequencer container 116 of the I/Q measurement recorder 110. In this context, the setting script 124 stores the setting UUIDs onto a setting store 125 or database, preferably by pushing the setting UUIDs on top of each other in the order of occurrence.

The application unit module 120 further performs processing of the results received as streams 119 from the I/Q measurement recorder or may wait for them to be processed to smaller sized measurement results on-site, depending in some cases on network conditions. In this regard, a dedicated result processing script 126 is incorporated within the container that receives the streams 119, associates the corresponding UUIDs with the respective measurement results and outputs the refined results 127 onto the user interface 130. The refined results 127 can be formulated in the form of user-defined HTTP callbacks, preferably incorporating JavaScript Object Notation (JSON) formats, e.g., Webhooks. Such callbacks advantageously allow for one time setting configuration, especially for complex settings, which significantly speeds up the parsing of the settings. It is to be noted that multiple application unit modules 120 can be associated to a different processing scheme, for instance, network analysis, spectrum analysis, signal analysis and so on.

Figure 4:
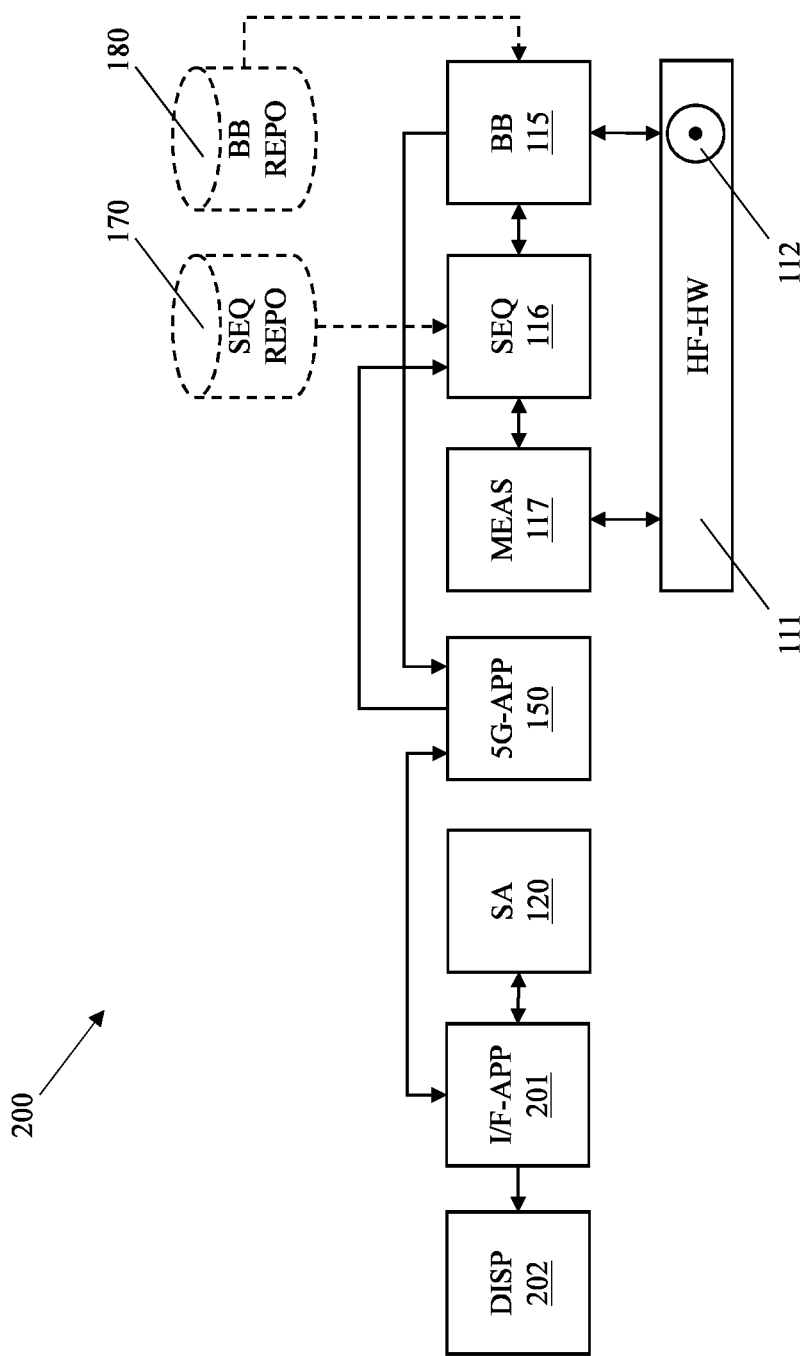
FIG. 4 shows a second exemplary embodiment of the system according to the first aspect of the invention.

In FIG. 4, a second exemplary embodiment of the system according to the first aspect of the invention is illustrated. Especially, FIG. 4 shows the modular application concept for a spectrum analyzer device. The device generally comprises the I/Q measurement recorder 110, such as the measurement hardware 111 and the RF input channel 112. The pre-processing blocks 115,116,117 as illustrated in FIG. 2 are also incorporated in the device in the form of Docker containers. The measurement unit module is preferably installed and executed herein, where the building block repository 180 and the sequence repository 170 for building block processing and sequencing are downloaded on the respective containers 115,116. In these modules are also pre-built-in standard files.

The application unit module 120, for instance, as illustrated along FIG. 3 in a Docker container form, is also installed onto the device along with additional applications (e.g., 5G App 150). The application unit module 120 refines the measurement results from the measurement segments of the device and processes into a display 202, for instance, a graphical user interface created by a widget toolkit 201 (e.g., QT App) in order to allow for cross-platform execution on various software/hardware platforms such as Linux, Windows, macOS, Android, etc.

The user can further configure the device for a specific nature of measurement and thereby generating I/Q measurement data, where the data are processed into measurement results by the measurement unit module and further post-processed onto the display 202 by the application unit module 120. As such, third party tools or applications are not required to be installed on the device which effectively saves time, eliminates the on-demand licensing procedure and further reduces the amount of human interactions.

Figure 5:
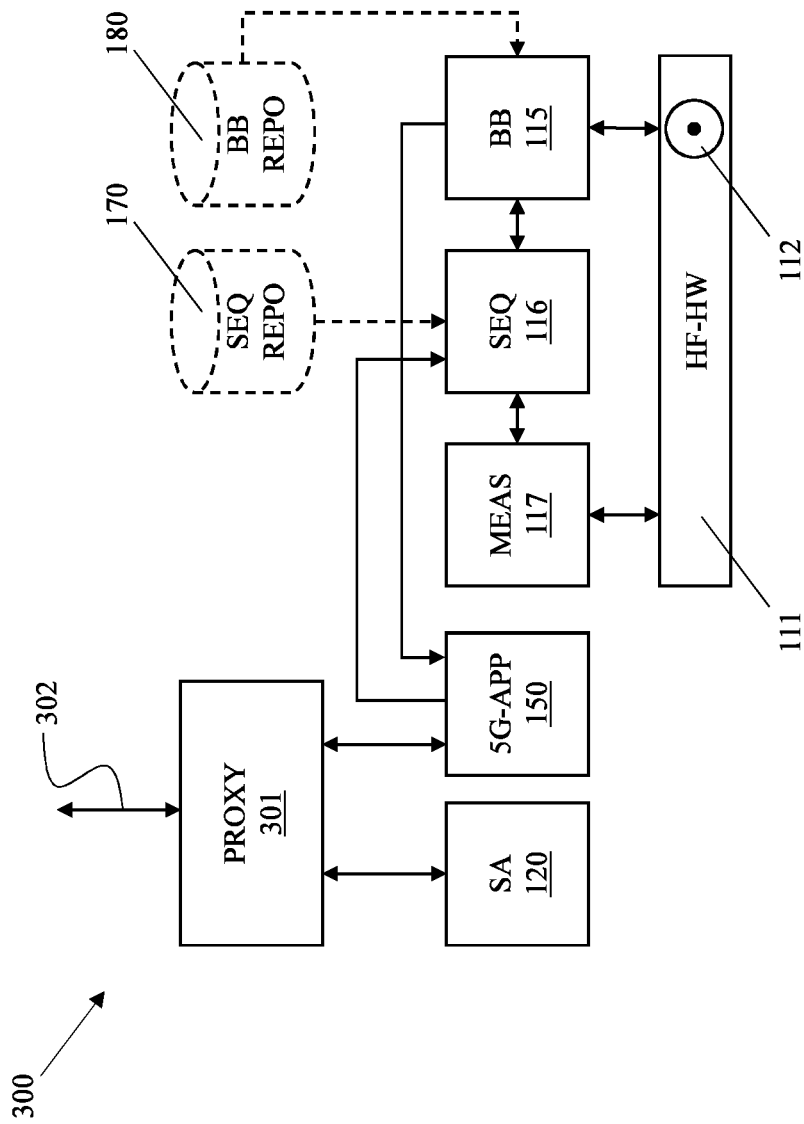
FIG. 5 shows a third exemplary embodiment of the system according to the first aspect of the invention.

In FIG. 5, a third exemplary embodiment of the system according to the first aspect of the invention is illustrated. Especially, FIG. 5 shows the modular application concept for a spectrum analyzer device, which differs from the concept illustrated along FIG. 4 in that the spectrum analyzer device of FIG. 5 does not comprise a display. In order to visualize the refined results from the application unit module 120 as well as to provide measurement configurations and settings, the user may communicate with the application unit module 120 Docker container as well as to any activated application on the device via a proxy 301 or balancer that allows for RESTful HTTP interface 302. Alternately, interface adapters based on Standard Commands for Programmable Instruments (SCPI) can also be incorporated for communicating with the device.

It is important to note that the modular application concept implemented in cloud (e.g., along FIG. 1) and on deice (e.g., along FIG. 4 resp. FIG. 5) result in an equivalent overall performance since the sequencer and processing (building block) are accessed/downloaded and executed by the measurement hardware. As a result, high performance measurement devices and cloud solutions can be built with the same software modules.

Figure 6:
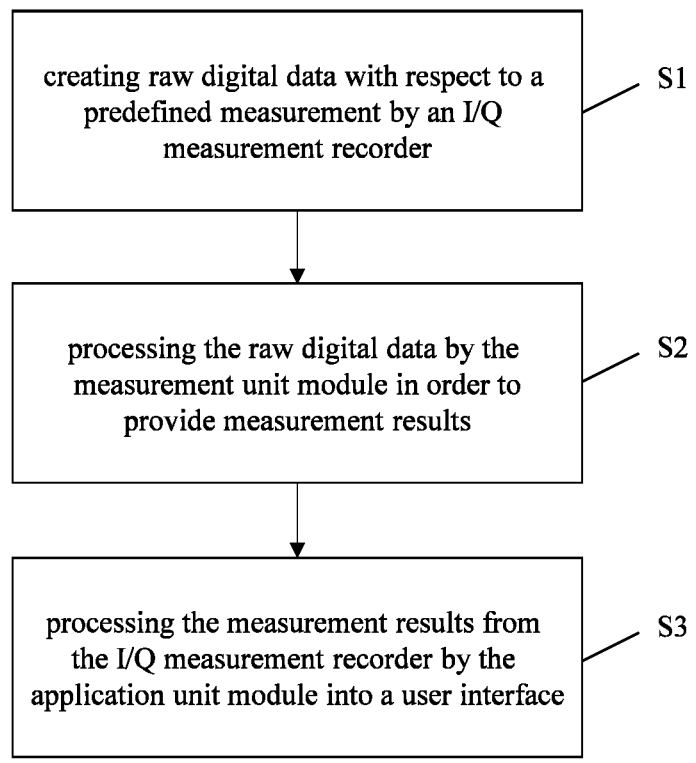
FIG. 6 shows an exemplary embodiment of the method according to the second aspect of the invention.

In FIG. 6, an exemplary embodiment of the method according to the second aspect of the invention is illustrated. In a first step S1, raw digital data are created with respect to a predefined measurement by an I/Q measurement recorder. In a second step S2, raw digital data are processed by the measurement unit module in order to provide measurement results. Finally, in a third step S3, the measurement results from the I/Q measurement recorder are processed by the application unit module into a user interface. The processing of the raw digital data into various measurement results can be split between the measurement unit module and application unit module based on one or more of: (a) result data size; (b) processing resources of the particular device with the module; (c) network availability; and (d) user preference.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents. For example, while an I/Q data recorder has been used in many examples, any other digital measurement data recorder is within the scope of the invention.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system for performing measurements in a modular application environment comprising:
    an I/Q measurement recorder adapted to create raw digital data with respect to a measurement, the raw digital data corresponding to I and Q data representing the in-phase and quadrature components, respectively, of an amplitude versus time series, and
    at least two modular applications, adapted to perform at least two different data processing schemes, where one comprises a measurement unit module and the other comprises an application unit module,
    wherein the measurement unit module is adapted to capture or process the raw digital data from the I/Q measurement recorder to generate measurement results, and
    wherein the application unit module is adapted to process the measurement results from the I/Q measurement recorder into a user interface for at least one of: network analysis of the measurement results, signal analysis of the measurement results, spectrum analysis of the measurement results.

2. The system according to claim 1, wherein the modular applications are modularly installed on the I/Q measurement recorder whereby the measurement unit module is included as an integral module and the application unit module is included as a separate module.

3. The system according to claim 1, wherein the processing of the raw digital data by the measurement unit module is executed on the I/Q measurement recorder.

4. The system according to claim 1, wherein the processing of the measurement results by the application unit module is executed on a cloud environment.

5. The system according to claim 1, wherein the measurement unit module is further adapted to be activated on-demand based on the measurement predefined on the I/Q measurement recorder.

6. The system according to claim 1, wherein the application unit module is further adapted to receive measurement instructions from a user via the user interface and is further adapted to create unique identifiers for the respective measurement instructions.

7. The system according to claim 6, wherein the unique identifiers are associated with requests directed towards the I/Q measurement recorder from the application unit module and are further associated with the measurement results provided from the I/Q measurement recorder to the application unit module.

8. The system according to claim 1, wherein the modular applications include more than one version of the same application and whereby the versions of the applications are modularly installed on the I/Q measurement recorder.

9. The system according to claim 1, wherein the system further comprises a modular software manager, provided on the user interface, adapted to facilitate user controllability for defining a measurement on the I/Q measurement recorder.

10. The system according to claim 9, wherein the modular software manager is further adapted to determine software required by the I/Q measurement recorder dynamically with respect to the defined measurement.

11. A method for performing measurements in a modular application environment comprising the steps of:
    creating, by an I/Q measurement recorder, raw digital data with respect to a measurement, the raw digital data corresponding to I and Q data representing the in-phase and quadrature components, respectively, of an amplitude versus time series,
    performing at least two different data processing schemes by at least two modular applications, one comprising a measurement unit module and the other comprising an application unit module,
    capturing or processing, by the measurement unit module, the raw digital data from the I/Q measurement recorder to generate measurement results, and
    processing, by the application unit module, the measurement results from the I/Q measurement recorder into a user interface for at least one of: network analysis of the measurement results, signal analysis of the measurement results, spectrum analysis of the measurement results.

12. The method according to claim 11, wherein the method further comprises the step of modularly installing the modular applications on the I/Q measurement recorder whereby including the measurement unit module as an integral module and the application unit module as a separate module.

13. The method according to claim 11, wherein the method further comprises the step of executing the processing of the raw digital data by the measurement unit module on the I/Q measurement recorder.

14. The method according to claim 11, wherein the method further comprises the step of executing the processing of the measurement results by the application unit module on a cloud environment.

15. The method according to claim 11, wherein the method further comprises the step of activating the measurement unit module of the respective modular applications on-demand based on the measurement predefined on the I/Q measurement recorder.

16. The method according to claim 11, wherein the method further comprises the step of receiving measurement instructions from a user via the user interface and whereby creating unique identifiers for the respective measurement instructions.

17. The method according to claim 16, wherein the method further comprises the steps of:
   associating the unique identifiers with requests directed towards the I/Q measurement recorder from the application unit module, and
   associating the unique identifiers with the measurement results provided from the I/Q measurement recorder to the application unit module.

18. The method according to claim 11, wherein the modular applications include more than one version of the same application and the method further comprises the step of modularly installing the versions of the applications on the I/Q measurement recorder.

19. The method according to claim 11, wherein the method further comprises the step of facilitating user controllability for defining a measurement on the I/Q measurement recorder by a modular software manager, provided on the user interface.

20. The method according to claim 19, wherein the method further comprises the step of dynamically determining software required by the I/Q measurement recorder with respect to the defined measurement by the modular software manager.

* * * * *